United States Patent
Koo et al.

(10) Patent No.: US 8,725,005 B2
(45) Date of Patent: May 13, 2014

(54) DYNAMIC IMPEDANCE PHOTODETECTOR RECEIVER CIRCUIT

(75) Inventors: Kyung Hoae Koo, Stanford, CA (US); Marco Fiorentino, Mountain View, CA (US); David A. Fattal, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 98 days.

(21) Appl. No.: 13/202,940

(22) PCT Filed: Feb. 23, 2009

(86) PCT No.: PCT/US2009/034896
§ 371 (c)(1), (2), (4) Date: Aug. 23, 2011

(87) PCT Pub. No.: WO2010/096064
PCT Pub. Date: Aug. 26, 2010

(65) Prior Publication Data
US 2011/0299856 A1    Dec. 8, 2011

(51) Int. Cl.
*H04B 10/06* (2011.01)

(52) U.S. Cl.
USPC .......... 398/202; 398/208; 398/209; 398/210; 398/214; 398/135; 398/136; 398/139; 398/164; 398/140; 330/308; 330/59; 250/214 A; 250/214 AG; 250/214 LA

(58) Field of Classification Search
USPC ......... 398/202, 135, 208, 209, 210, 214, 136, 398/137, 138, 139, 163, 164, 140, 141, 158, 398/159, 154, 155; 330/308, 59, 310, 263, 330/264; 250/214 A, 214 AG, 214 LA, 214 R
See application file for complete search history.

(56) References Cited

U.S. PATENT DOCUMENTS

| 5,455,705 | A | 10/1995 | Gusinov |
| 6,084,478 | A * | 7/2000 | Mayampurath ............... 330/308 |
| 7,042,295 | B2 | 5/2006 | Guckenberger et al. |

(Continued)

FOREIGN PATENT DOCUMENTS

| CN | 2203514 | 7/1995 |
| CN | 1223507 | 7/1999 |

(Continued)

OTHER PUBLICATIONS

Debaes, Christof et al.; "Receiver-Less Optical Clock Injection for Clock Injection for Clock Distribution Networks"; Journal; Mar./Apr. 2008; pp. 400-409; vol. 9, No. 2; IEEE Journal of Selected Topics in Quantum Electronics.

*Primary Examiner* — Hanh Phan

(57) ABSTRACT

A photodetector receiver circuit for an optical communication system includes an optical photodetector which receives optical signals and converts them into an electrical current. In one illustrative embodiment, a dynamic impedance module which switches the receiver circuit between a high impedance state and a low impedance state and a buffer stage which receives the electrical current and converts the electrical current into a voltage signal compatible with a digital circuit. A method for receiving an optical signal includes, receiving the optical signal and converting it into an electrical pulse train, switching a dynamic impedance module between a high impedance state and a low impedance state, transforming the electrical pulse train into an output voltage signal using a buffer stage, and receiving the output voltage signal by a digital circuit.

15 Claims, 7 Drawing Sheets

(56) References Cited

U.S. PATENT DOCUMENTS

| | | |
|---|---|---|
| 7,050,724 B1 | 5/2006 | Rantakari |
| 7,135,932 B2 | 11/2006 | Quadir et al. |
| 2005/0168276 A1 | 8/2005 | Gupta et al. |
| 2009/0245807 A1* | 10/2009 | Nomura .................. 398/135 |

FOREIGN PATENT DOCUMENTS

| | | |
|---|---|---|
| CN | 101174902 | 5/2008 |
| EP | 0691742 | 1/1996 |
| JP | 832525 | 2/1996 |

* cited by examiner

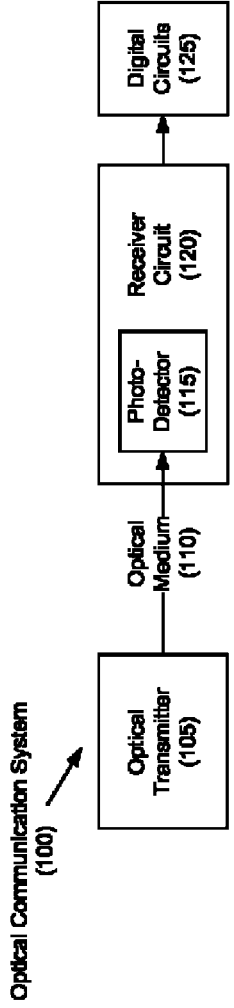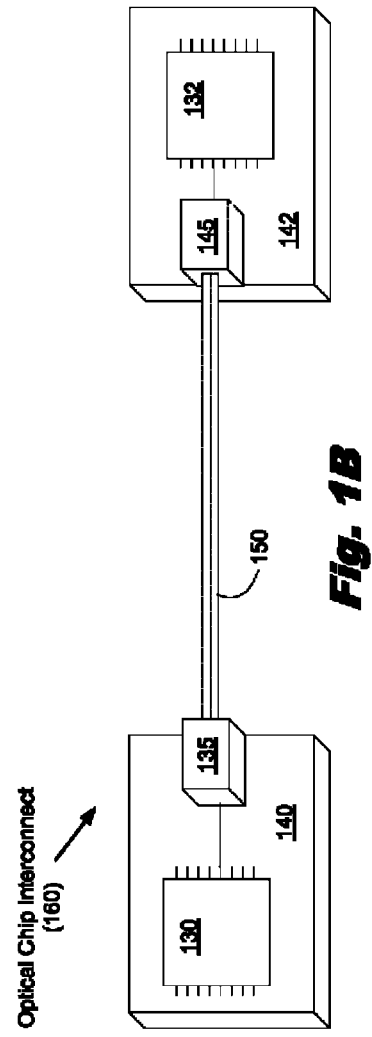

US 8,725,005 B2

DYNAMIC IMPEDANCE PHOTODETECTOR RECEIVER CIRCUIT

BACKGROUND

Light beams or optical signals are frequently used to transmit digital data between electronic devices, both over long distances and between adjacent circuit boards or even between components on a single circuit board. An optical signal may also be used for other purposes including position or motion sensing, measurement, reading encoded data, etc.

Consequently, optical technology plays a significant role in modern electronics, and many electronic devices employ optical components. Examples of such optical components include, but are not limited to, optical or light sources such as light emitting diodes and lasers, waveguides, fiber optics, lenses and other optics, photo-detectors and other optical sensors, optically-sensitive semiconductors, and others.

An optical communication system typically involves taking an electronic signal and converting it to an optical signal for transmission through an optical medium. Once the optical signal reaches its destination, it is converted back to an electrical signal so it can be processed by digital logic circuits.

The receiving end of the optical communication system typically involves a receiver circuit which includes a photo-detector. The detector, which may be a photodiode, converts an optical signal into an electrical current. The receiver circuit then takes the electrical current which has been generated by the photodetector and amplifies it to a voltage level suitable for standard digital logic circuits.

The receiver circuit performs important amplification and filtering operations to produce a voltage signal that is compatible with the digital logic circuits. Receiver circuits typically consist of a trans-impedance amplifier or a sense amplifier. While these amplifiers may perform the desired amplifying function, they consume a relatively large amount of power and can often generate undesirable noise, jitter, and delay. Ideally, a receiver circuit would consume much less power and produce significantly less noise, jitter, and delay than implementations which use trans-impedance and sense amplifiers.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIGS. 1A and 1B are diagrams of an illustrative optical communication system, according to one embodiment of principles described herein.

Throughout the drawings, identical reference numbers designate similar, but not necessarily identical, elements.

DETAILED DESCRIPTION

Figure 2:
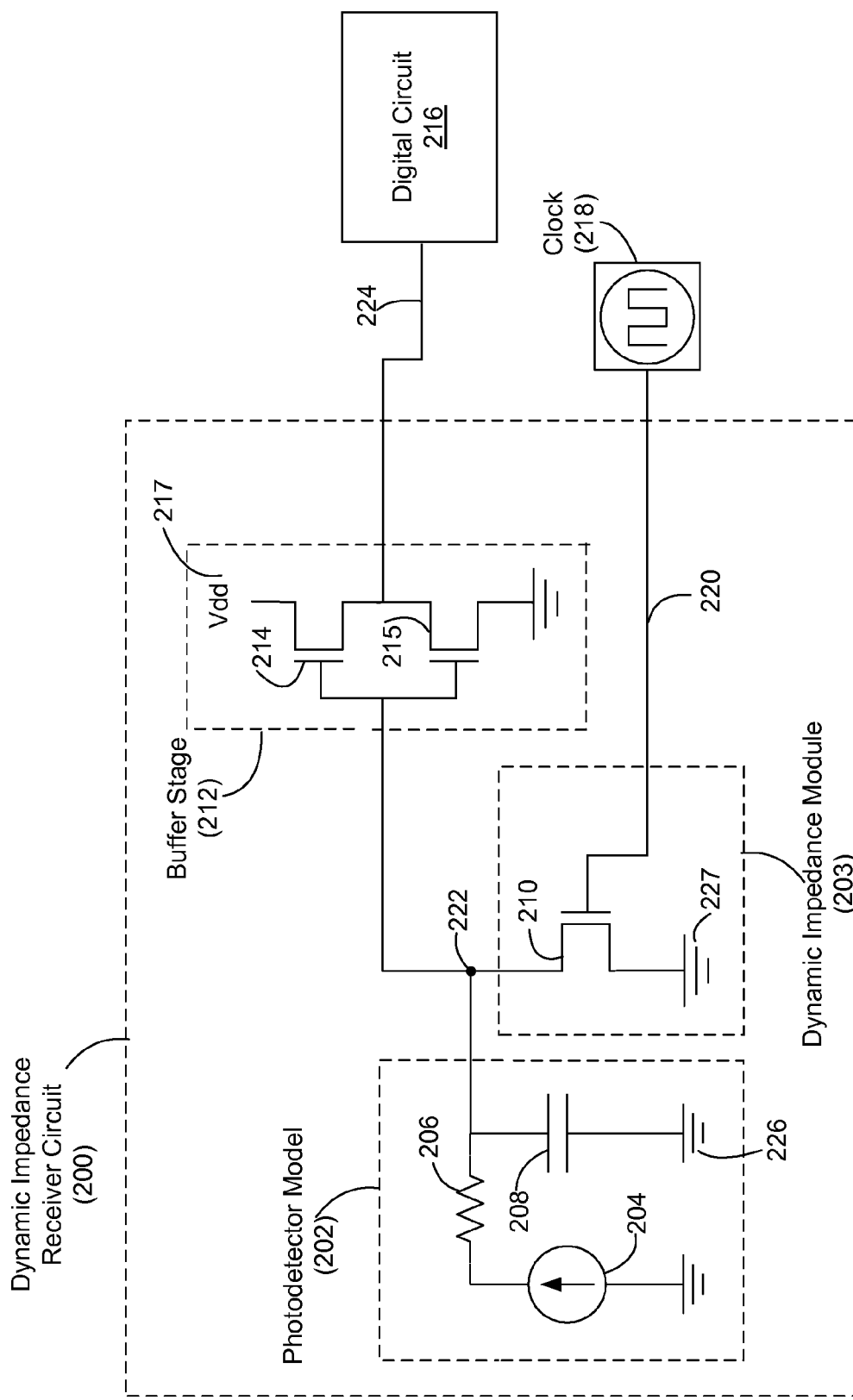
FIG. 2 is a schematic of an illustrative receiver circuit which uses a clock signal to alternate between high and low input impedance, according to one embodiment of principles described herein.

The present specification relates to a receiver circuit for an optical communication system. This receiver circuit is different from traditional receiver circuits because it does not use a trans-impedance amplifier or sense amplifier. Consequently, the receiver circuit consumes less power and produces significantly less noise, jitter, and delay when compared with other receiver circuits. According to one embodiment, the illustrative receiver circuit described herein accepts small electrical signals that have been generated by optical energy incident on a photodetector. The illustrative receiver circuit then uses dynamic impedance and a buffer stage to translate the small electrical signals into voltage swings which are compatible with digital logic without the need of traditional amplifying methods. Application No. PCT/US 08/74492, filed Aug. 27, 2008, discloses a number of illustrative photodiode receiver circuits and is hereby incorporated by reference in its entirety.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

As used in the present specification and appended claims, the term "optical energy" or "optical signal" refers to radiated energy having a wavelength generally between 10 nanometers and 500 microns. Optical energy as thus defined includes, but is not limited to, ultraviolet, visible, and infrared light.

As used in the present specification and appended claims, the term "optical source" or "optical transmitter" refers to a device from which optical energy originates. Examples of optical sources as thus defined include, but are not limited to, light emitting diodes, lasers, light bulbs, and lamps.

FIG. 1A shows basic components of an illustrative optical communication system (100). An optical transmitter (105) transforms electrical signals into optical signals. These optical signals are then propagated through an optical medium (110). The transmitted optical signals can include one or more optical frequencies which may be selected from infrared, visible or ultraviolet spectra. Optical media can include free space or various optical waveguides such as fibers. A photo-detector (115) with a receiver circuit (120) takes the optical signal and transforms it back into an electrical signal. A photodetector is a light-sensitive device which transforms the energy from the optic signal into electrical energy. According to one illustrative embodiment, the photodetector (115) may be a photodiode which includes p-n junction which absorbs incident optical energy and generates a proportional electrical current. A variety of other photodetectors could be used such as photoresistors, photovoltaic cells, pyroelectric detectors, charge coupled devices, or other suitable devices. A receiver circuit (120) then takes the electrical current from the photodetector and transforms it into an electrical voltage signal suitable for digital logic circuits (125).

An optical interconnect between integrated circuits (a "chip interconnect") is one example of an optical communication system which may include a receiver circuit. A chip interconnect provides an optical communication channel between two integrated circuits which may or may not be on the same circuit board. One part of a circuit board could include an optical transmitter, typically a laser. Another part on the circuit board would include a photodetector and receiver circuit. These two points on the circuit board could be transmitting data from a processor to a memory module or from a memory module to a processor. There are several advantages to transmitting the signal optically as opposed to electrically. Optical signals are able to achieve a higher bandwidth. Electrical transmission lines are subject to crosstalk and are limited by capacitive and inductive affects. Optical lines however, are also not limited by the capacitive and inductive effects that electrical lines are subject to. In some circumstances, optical communication channels may consume less power. However, one factor which increases the demand for power in an optical system is the efficiency of the electrical-to-optical conversion of the transmitter and the optical-to-electrical conversion of the receiver. The present specification describes several illustrative embodiments which are directed toward improving the efficiency of the optical-to-electrical conversion and reduce the required power to drive this conversion.

FIG. 1b shows an illustrative optical chip interconnect (160). Various digital components (130, 132) such as processors or memory modules are mounted on circuit boards (140, 142). One digital component may need to transmit data to another digital component. The sending digital component (130) connects to a transmitter (135) which takes the digital electrical signal and converts it to an optical signal (150), such as a series of short bursts of laser energy which form an optical pulse train. The receiving digital component (132) is connected to a detector and receiver circuit (145). The detector takes the photons from the laser beams and creates a corresponding electrical pulse train which the receiver (145) amplifies enough to be used by the digital logic circuitry (132).

The embodiments for the receiver circuit described herein relate to a free space optical system; however, the circuit may also be embodied in systems which use various optical waveguides as a medium to carry optical signals from source to destination.

FIG. 2 is a circuit diagram of an illustrative dynamic impedance receiver circuit (200) which takes the electrical signal from a photodetector and conditions it for use by a digital logic circuit. According to one illustrative embodiment, the receiver circuit (200) includes a photodetector (202), a buffer stage (212), and a transistor (210). The elements within the first dotted box (202) are components which describe the output characteristics of the photodetector. When an optical pulse is received, an electrical pulse is generated by the detector (202). The electric current which comes from the photodetector is represented in the schematic as a current source (204). Inherent in electrical devices and circuits is some amount electrical resistance and electrical capacitance. For example, electrical resistance can arise as a result of limited cross-sections of traces, material impurities, contact resistances and other issues. Stray capacitance is also inherent in electrical circuits due to proximity of two adjacent conductors. In the illustrative photodiode (202) this inherent resistance is modeled as resistor (206) and the junction capacitance is modeled as a capacitor (208), which is connected between the output and ground (226). Consequently, the electrical signals generated by the current source (204) are modified by the resistor (206) and the capacitor (208), then output to exterior circuit elements.

The main input node for the receiver (222) is connected to a dynamic impedance module (203). In the dynamic impedance module (203), one side of a Metal-Oxide-Semiconductor Field-Effect Transistor (MOSFET) device (210) with the other side of the MOSFET device (210) connected to ground (227). The exact channel dimensions and characteristics of this transistor can be determined by those skilled in the relevant art to fit the appropriate design requirements. This transistor device (210) is configured to act as a switch between the main input node (222) and a ground (227). According to one illustrative embodiment, when the input signal is low, the MOSFET disconnects the main output node (222) from the ground. When the input signal to the MOSFET is high, the MOSFET connects the main output node (222) to ground, thereby allowing electrical current to be discharged from the main output node (222) to ground.

According to one illustrative embodiment, the gate to this MOSFET device (210) is connected to a clock signal (218) via the line (220). Digital systems often rely on a clock signal to drive various circuit elements. When the receiver circuit is embedded on a chip with other digital circuitry, the clock signal (218) can be connected to the gate of the transistor (210). The MOSFET device (210) acts as a switch which is turned ON and OFF according to the high and low clock signals. This changes the input impedance of the receiver circuit (200) between a high impedance mode and a low impedance mode. Additionally or alternatively the receiver circuit may include its own clock, which may or may not be synchronized to other clocks within the larger system.

When the signal from the clock is high, the switch is ON and current can flow from the input node to ground (227). In this state, the receiver circuit (120) has low input impedance which allows the capacitance (represented by the capacitor (208)) within the photodetector (202) to discharge rapidly. Ideally, the capacitor (208) would be substantially discharged before the next pulse of optical energy strikes the photodetector (202) and generates the next current pulse.

When the clock signal (218) is low, the transistor (210) is OFF and the input impedance of the receiver circuit (120) is high. In this stage, the pulse of current from the photodetector (202) is applied across the high impedance and is able to send a larger voltage through the receiver circuit and be used by the digital logic circuits (216) which the receiver (120) is connected to. The ideal impedance of the transistor (210) in the OFF state is very high (near infinity), therefore the impedance is dominated by the capacitor. Consequently, the input voltage as a function of time can be calculated by multiplying the impedance of the capacitor by the current and taking a simple Laplace transform.

When the pulse from the photodetector is a signal that is meant to be propagated through to the digital circuitry (216), the signal is first received by a buffer stage (212). In this embodiment, the buffer stage is a logic gate inverter made up of two MOSFET transistors (214, 215). The transistors are designed so that when a high signal enters the logic gate inverter, the transistor (214) which is connected to a voltage source Vdd (217) is turned OFF and the transistor (215) which is connected to ground (226) is turned ON. In this state, the current flowing into the inverter goes to ground and the output signal is low. If the signal going into the inverter is low, the transistor (214) on top is turned on and the transistor (215) on bottom is turned off. In this state, the higher voltage level supplied by Vdd (217) is output to the digital circuitry. Thus, the buffer stage time shifts the input signal and generates an output voltage at a more appropriate level for driving the digital logic circuitry (216). The exact characteristics and configuration of the buffer can be tailored to the specific needs of the system.

Figure 3:
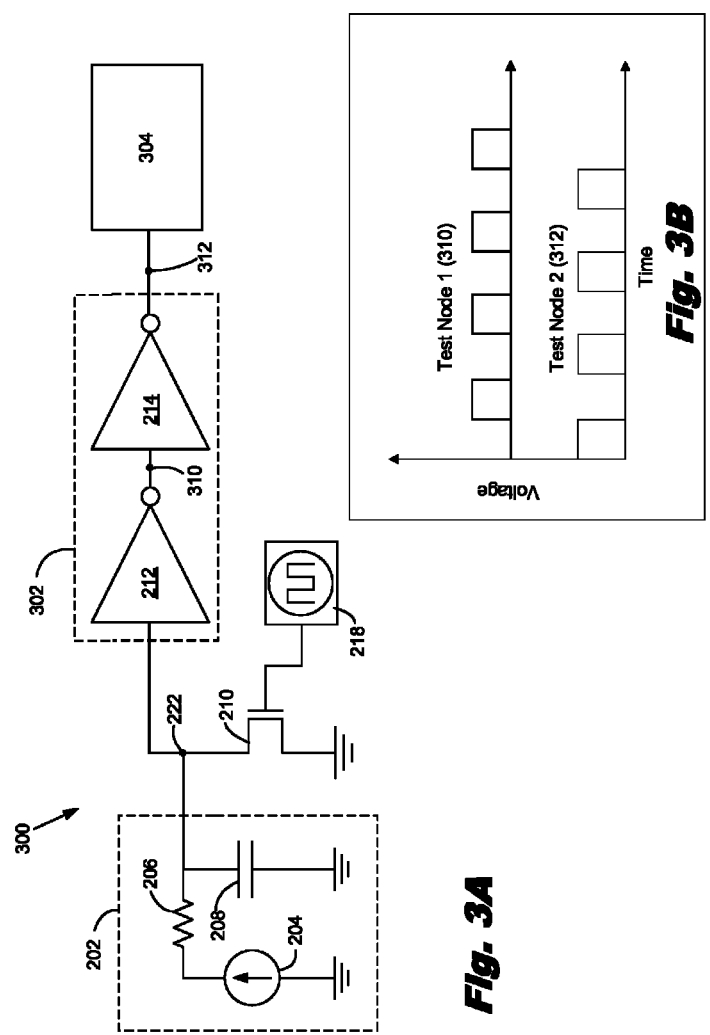
FIGS. 3A and 3B are, respectively, an illustrative circuit schematic showing a buffer stage which incorporates more than one inverter and a graph representing voltage levels at two separate nodes, according to one embodiment of principles described herein.

FIG. 3A is a simplified schematic diagram of an illustrative receiver circuit (300). At times, the load from the digital circuitry (304) may be too heavy for the receiver circuit to drive with a buffer stage consisting of only one inverter. FIG. 3A shows a second inverter (212) as part of the buffer stage (302). Although two inverters are shown in the buffer stage, a buffer with any number of inverters deemed appropriate by those skilled in the relevant art may be used. For example, the number of inverters can be adjusted to determine whether a high input signal is translated into a high or low output signal at output node (312) or to improve the Bit Error Rate (BER).

FIG. 3B is a graph of the voltage signal at a test node 1 (310) and test node 2 (312). The vertical axis represents voltage, and the horizontal axis represents time. This graph illustrates how the logic gate inverter which is included in the buffer (302) flips the signal from low to high or from high to low. The top graph (314) represents the voltage at test node 1 (310), and the bottom graph (316) represents the voltage at test node 2 (312). It can be seen that when test node 1 (310) is high, test node 2 (312) is low. Conversely, when test node 1 (310) is low, test node 2 (312) is high. The graphs in FIG. 3B represent ideal behavior of the buffer (302). For example, the graphs show an instantaneous rise from low to high and an instantaneous drop from high to low, but in practice there is an associated rise time and an associated fall time.

Figure 4:
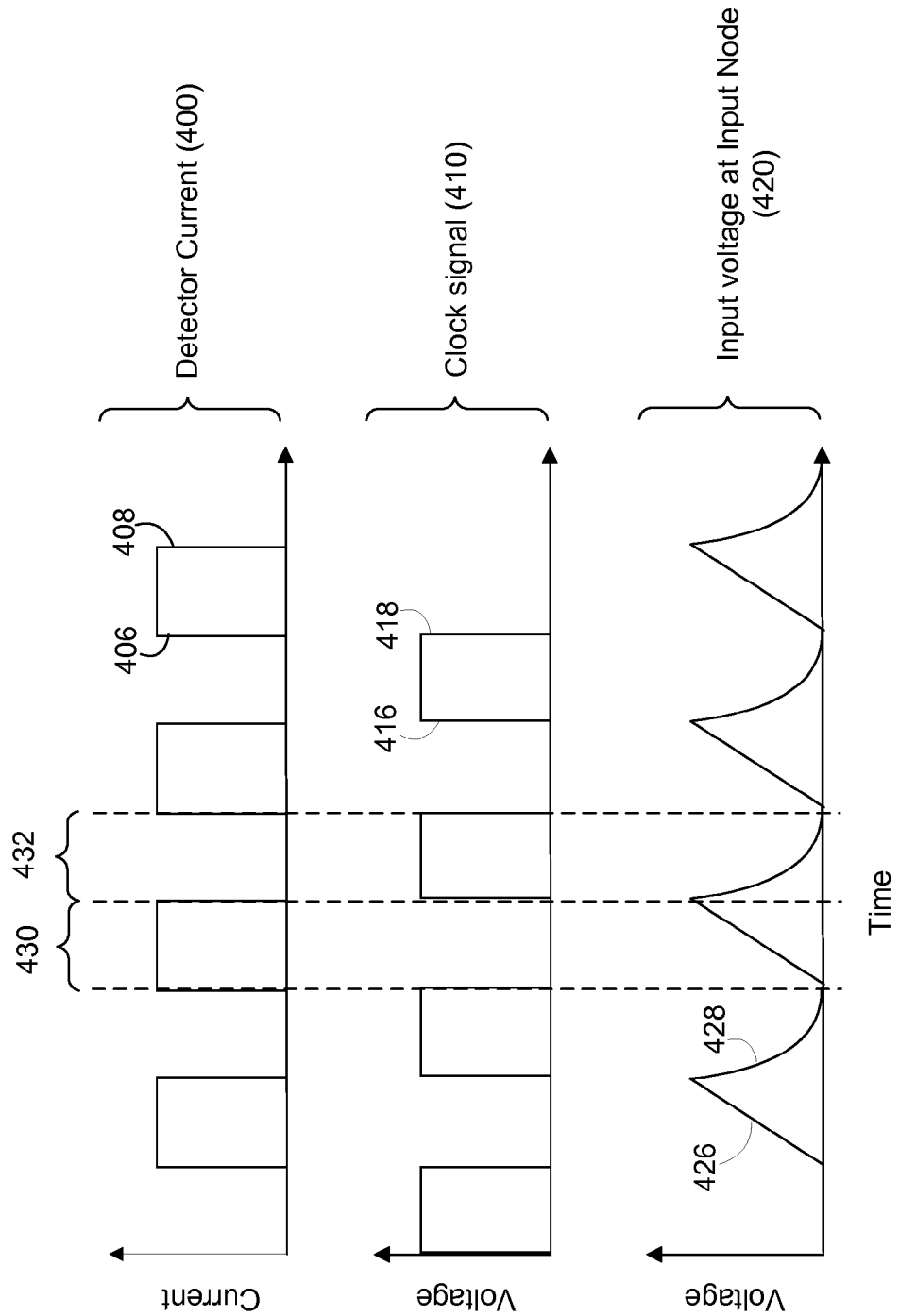
FIG. 4 is a set of graphs representing illustrative current and voltage levels at various points in a receiver circuit which uses a clock signal to switch between impedance modes, according to one embodiment of principles described herein.

FIG. 4 is a graphical representation of the current and voltage at various locations with the illustrative receiver circuit shown in FIG. 3A. The vertical axes of the graphs represent voltage or current and the horizontal axes represent time. All three graphs (400, 410, 420) are aligned so that they share the same time increments and scale along the horizontal axis. This provides a time synchronized representation of the receiver operation. The top graph (400) is a measurement of the electrical current coming from the photodetector (204). The vertical axis (402) represents the current, and the horizontal axis (404) represents time. The overall appearance is that of a square wave. The input signal rises at leading edge (406) to a high position and holds for an amount of time. The signal then rapidly decreases as shown by the falling edge (408) to a low position and holds for an amount of time. Ideally, this current would be converted into voltage signals with high enough amplitudes to be accepted by the digital circuit (304).

The middle graph (410) represents the voltage of the clock signal (218). Like the input current from the photodetector (218) it is a square wave. The vertical axis (412) represents the voltage, and the horizontal axis (414) represents time. Once again, the signal rises (416) to a high position and holds; then it falls (418) to a low position and holds. The circuit is timed so that when the input signal (204) is high, the clock signal (218) is low. Also, when the input signal (204) is low, the clock signal (218) is high. Even though the top graph and the middle graph show an instantaneous rise in signal level from low to high and an instantaneous drop in signal level from high to low, in practice there is an associated rise time and an associated fall time. For purposes of explanation, the graphs in FIG. 4 represent idealized behavior of the receiver circuit (300).

The bottom graph (420) measures the voltage at the main input node (222) of the receiver circuit. This is also a measurement of the voltage across the capacitor (208) representing the capacitance resulting from the junction between the photodetector and the receiver circuit. The vertical axis (422) represents the voltage while the horizontal axis (424) represents time. When a current is applied, the capacitor (208) will begin to charge linearly (426). When there is no current being applied and the input impedance of the circuit is set to be low, the capacitor will discharge (428) exponentially based on a function involving a time constant which results from the input impedance of the receiver circuit and the capacitance due to the junction between the photodetector and the receiver.

Referring to the time window (430) when the input from the photodetector is high and the clock signal is low, this is the stage where the input impedance is high. The clock signal (218, FIG. 3A) is low, which will turn the transistor (210, FIG. 3A) off. The electrical current from the photodetector is being applied to the high impedance. The input impedance is the parallel combination of the characteristic impedance of the capacitor (208) and the resistance of MOSFET (210) assuming the contribution from the resistance (206) is negligible. The input impedance is mainly determined by the capacitance because the effect of resistance from (210) is smeared out by its high magnitude. The input impedance is inversely proportional to the capacitance (208) and frequency of the incoming signal. The resulting voltage is the product of the current times the impedance. As discussed above, it is important to have very small input capacitance (208) because it reduces the time for the input voltage at the node (222) to reach the supply voltage level. As discussed above, it is desirable that the output voltage from the buffer (302, FIG. 3A) should be at a high enough level that it is compatible with the digital circuitry (304, FIG. 3A). Also during this time, the capacitor (208, FIG. 3A) is being charged linearly as a function of time. This is not desirable to maintain the charge within the capacitor (208, FIG. 3A) and so there needs to be a way for the capacitor to discharge in between pulses from the detector. During a second window (432), there is no longer a current coming from the photodetector. The clock signal (218, FIG. 3A) is timed so that it is high during this time window. When the clock signal is high, the transistor (210) is ON, and the input impedance of the receiver circuit is a substantially reduced. The rate at which the capacitor discharges is dependent upon a time constant. As discussed above, this time constant is calculated by multiplying the resistance of MOSFET (210) by the capacitance. The smaller the time constant, the shorter the amount of time it will take for the capacitor (208, FIG. 3A) to discharge and be ready for the next pulse from the detector (204, FIG. 3A). Consequently, during this time window it is desirable to have low impedance and thus a low time constant.

In one illustrative embodiment, an additional component may be interposed between the clock (218, FIG. 3A) and the transistor (210, FIG. 3A) to manipulate the clock signal into a more desirable form. For example, a digital counter may be interposed between the clock and the transistor (210). This digital counter could be used for a variety of functions such as changing the frequency at which the transistor switches between ON and OFF. For example, if the clock is running at 4 Ghz, and the data needs to be transmitted at 2 Ghz, a counter could be used to adjust the frequency of the signal coming from the clock to make it fit the needs of the receiver circuit. A variety of other devices could be used to alter the frequency at which the receiver circuit operates relative to the clock signal.

Figure 5:
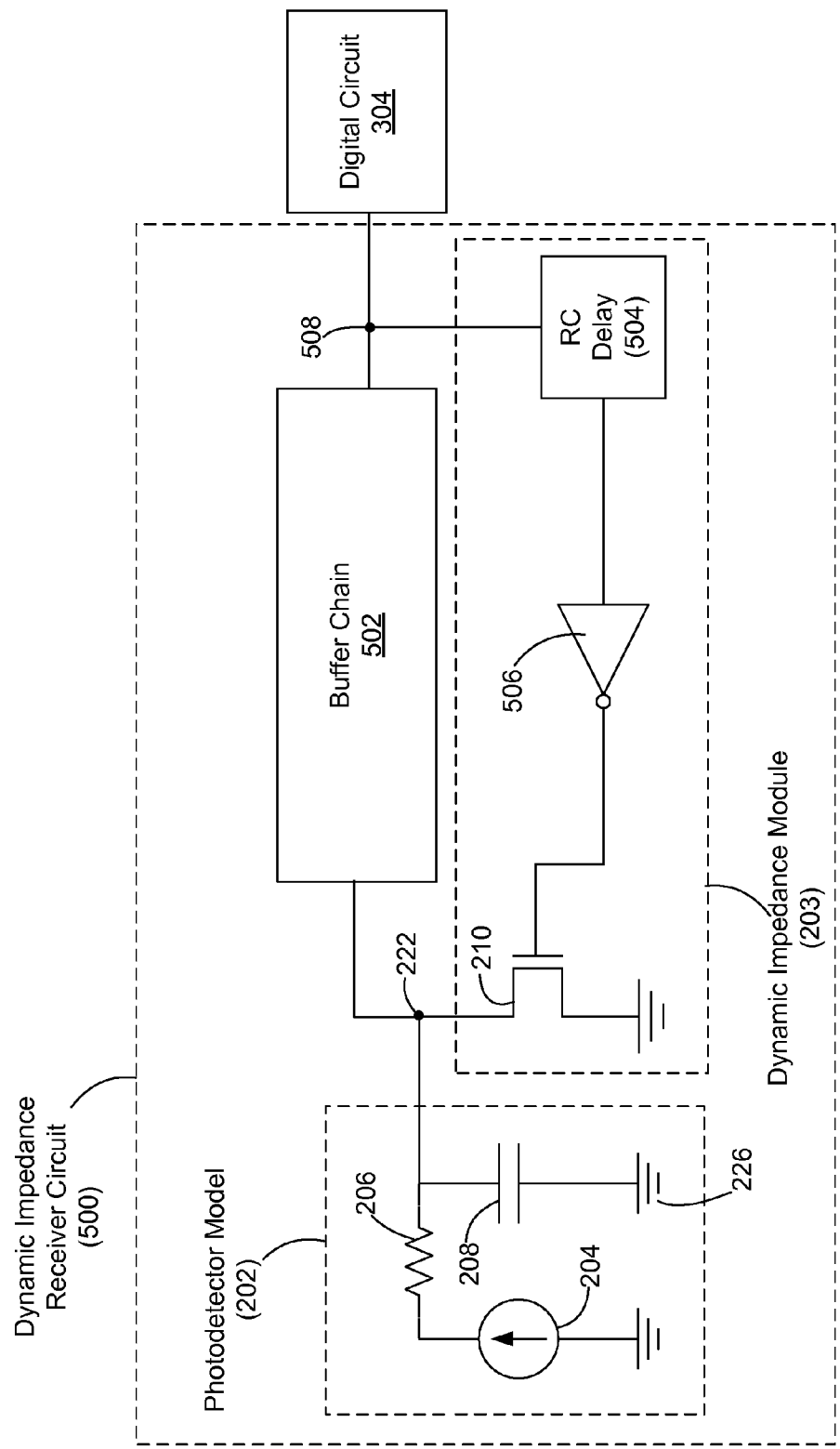
FIG. 5 is a schematic of an illustrative receiver circuit that uses a Resistance/Capacitance (RC) delay circuit to alternate between high and low input impedance states, according to one embodiment of the principles described herein.

In some circumstances it may be desirable to use a receiver circuit where easy access to a clock signal is not available. According to one illustrative embodiment, a delay circuit can be substituted for a clock signal and used to change the input impedance of the receiver circuit. FIG. 5 is a circuit schematic of an illustrative receiver circuit (500) that uses a Resistance/Capacitance (RC) delay circuit (504) as part of the feedback into the transistor (210) which switches the input impedance between high and low. In FIG. 5, a buffer chain (502) is shown to represent whatever number of inverters is used for the buffer stage. At the end of the buffer chain, the line splits at the node (508). It goes to the digital circuitry (304) and also goes to an RC delay circuit (504).

An RC delay circuit (504) includes a capacitor and a resistor which are selected to produce the desired time constant. The time constant is calculated by multiplying the resistance in ohms and the capacitance in farads. Whatever signal goes into the RC delay circuit comes out after a delay which is proportional to the time constant. For the speeds which data is typically processed at, this time is usually in the nanosecond range. When a pulse is going through the node (508) to the digital circuit, the transistor (210) will have been on, giving the circuit high input impedance. As described above, the combination of a high input impedance and current from the detector produces an appropriate voltage signal which is feed into the buffer chain (502). When the signal is passed out of the buffer chain, the RC delay circuit will send a high signal back to the transistor (210), turning it off. The signal delay needs to be long enough so that the digital circuitry (304) can properly receive the signal from the buffer chain (502). The signal also cannot be delayed too long or it will not switch the transistor (210) on in time. The transistor needs to be turned on so that the capacitor (208) will discharge properly so that the built up charge will not interfere with the next pulse coming from the photodetector (204).

Additionally, it may desirable to put an inverter buffer stage (506) between the RC delay circuit (504) and the transistor (210). This inverter buffer stage (506) can be used to further manipulate the feed back signal so that transistor is turned on and off when necessary, thus switching between high and low input impedance when appropriate.

Figure 6:
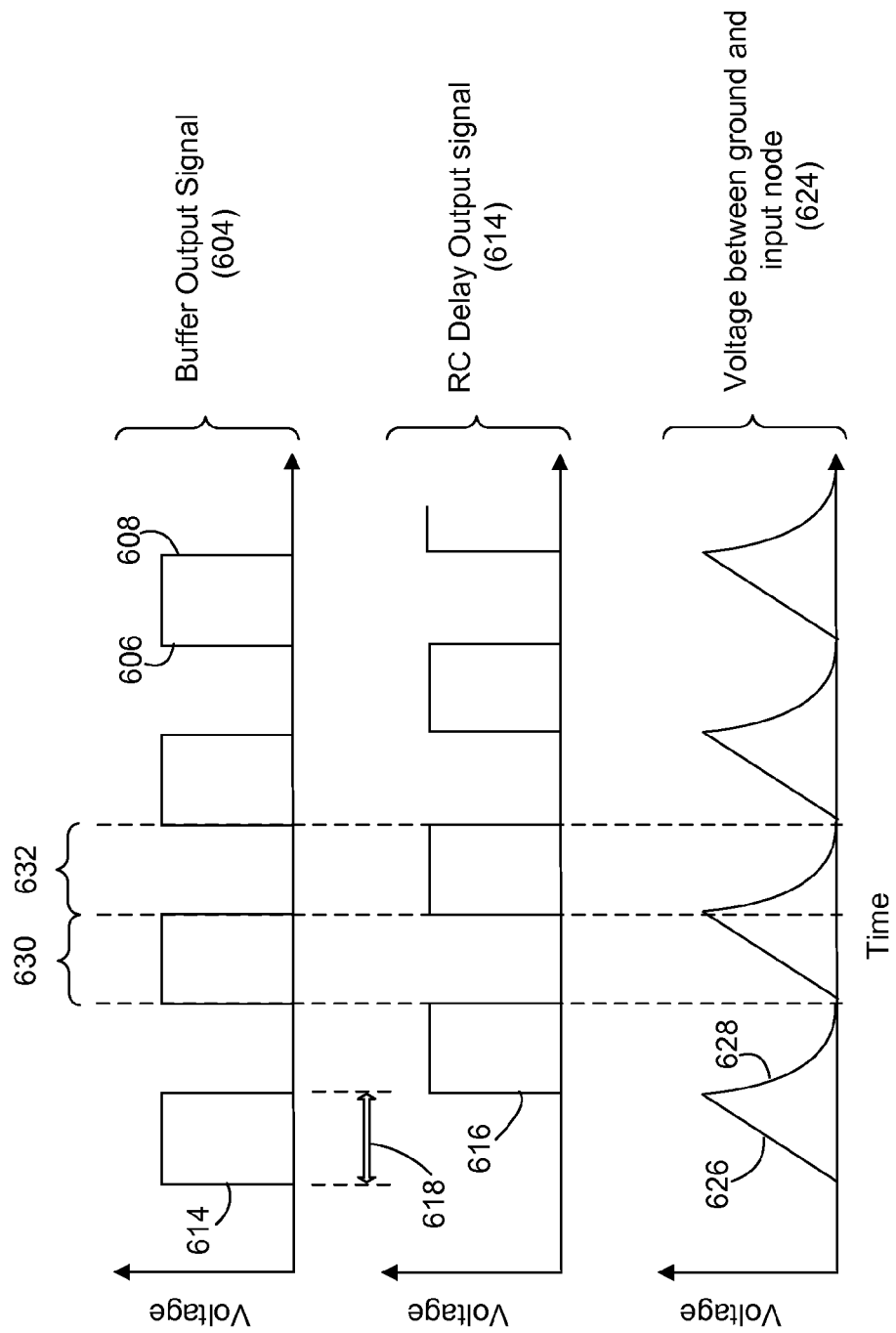
FIG. 6 is a graph representing the voltage levels at various points in an illustrative receiver circuit which uses an RC delay circuit to switch between impedance states, according to one embodiment of the principles described herein.

FIG. 6 is a set of graphs representing the voltage levels at various points in a receiver circuit (500, FIG. 5) which uses an RC delay circuit (504, FIG. 5) to switch between impedance modes. The top graph (600) is a measurement of the voltage at the output node (508, FIG. 5) of a receiver circuit which uses an RC delay circuit (504, FIG. 5). The vertical axis represents the voltage and the horizontal axis represents time. The voltage output may have a variety of characteristics and variations but is illustrated as a square wave for purposes of illustration. The output signal is driving the digital circuitry (304, FIG. 5) associated with the receiver circuit (500, FIG. 5). The signal rises (606) and holds for an amount of time, then falls (608) and holds for an amount of time.

The middle graph (610) represents the voltage level after the signal from the output graph has gone through the RC delay circuit (504, FIG. 5). Again, the vertical axis represents the voltage, and the horizontal axis represents time. The timing of the rising part of the signal before the signal goes through the RC delay circuit (504, FIG. 5) is set so that when the signal comes out of the RC delay circuit, it approximately lines up with the falling part of the signal before it entered the delay circuit (504). The delay between a rising edge (614) of the buffer output signal and a rising edge (616) of the RC delayed output signal is shown by an arrow (618). According to one illustrative embodiment, the RC delay circuit (504, FIG. 5) has been designed with the appropriate time constant as to delay the signal the width of the pulses in the buffer output signal (604). As discussed above, the square waves represented in the buffer output signal (604) and the RC delay output signal (614) are idealized waveforms used for purposes of explanation.

The bottom graph (620) measures the voltage between the input node (222) of the receiver circuit and ground (226). This is also a measurement of the voltage across the capacitor (208) representing the capacitance resulting from the junction between the photodetector and the receiver circuit. The vertical axis (622) represents the measured voltage and the horizontal axis (624) represents time. When a current is applied, the capacitor (208, FIG. 5) will begin to charge linearly (626). When there is no current being applied and the input impedance of the circuit is set to be low, the capacitor will discharge (628) based on a function involving a time constant which is related to the capacitance (208, FIG. 5) within the photodetector circuit (202, FIG. 5) and the input impedance of the receiver circuit (500).

A first time window (630) shows the time period during which the input from the photodetector (202, FIG. 5) is high and the signal from the RC delay circuit (504, FIG. 5) is low. During the first time window (630) the input impedance is high. The signal from the delay circuit (504, FIG. 5) is low which will turn the transistor (210, FIG. 5) OFF. Consequently, the signal from the photodetector (202, FIG. 5) is being applied to the high impedance. Also during the first time window, the capacitor (208, FIG. 5) is being charged linearly as a function of time. It is not desirable to maintain this charge within the capacitor (208).

During a second time window (632), there is no longer a current coming from the detector (202, FIG. 5). The RC delay circuit (504, FIG. 5) is timed so that it is high during the second time window (632). When the delay circuit (504, FIG. 5) signal is high, the transistor (210, FIG. 5) is ON, and the input impedance of the receiver circuit (500) is much lower. As discussed above, the rate at which the capacitor (208, FIG. 5) discharges is a function involving a time constant which is related to the capacitance (208, FIG. 5) within the photodetector circuit (202, FIG. 5) and the resistance of the MOSFET (210). During the second time window (632), it is desirable to have the lowest possible time constant. The lower the time constant, the faster the capacitor (208) will discharge.

Figure 7:
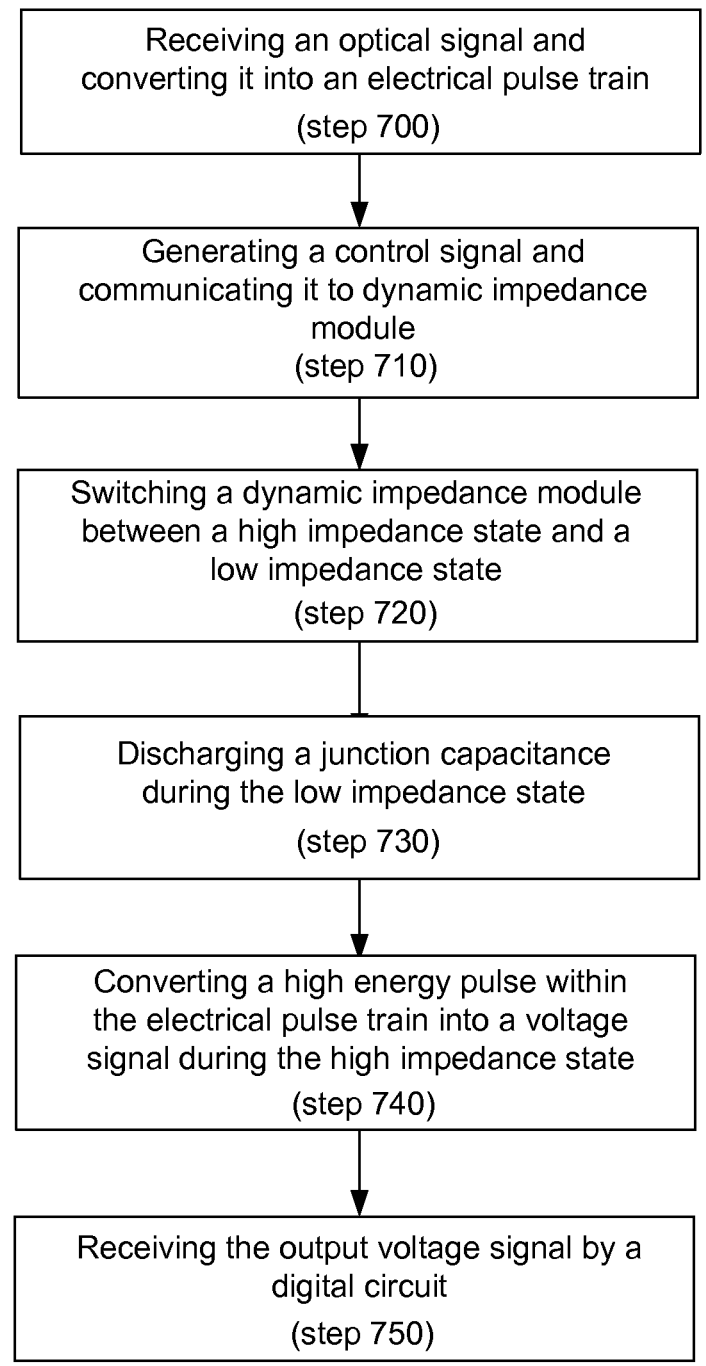
FIG. 7 is a flow diagram of one illustrative method for receiving an optical signal using a dynamic impedance receiver circuit, according to one embodiment of principles described herein.

FIG. 7 is a flow diagram of one illustrative method for receiving an optical signal using a dynamic impedance receiver circuit. In a first step, an optical signal is received by a photodetector and converted into an electrical pulse train (700). As discussed above, the optical signal may include pulses of optical energy which have different frequencies, pulse lengths, and signal amplitudes. According to one illustrative embodiment, the photodetector receives only one frequency of optical energy and converts this optical energy into a corresponding electrical pulse train. The electrical pulse train may include pulses of electrical energy having different pulse lengths and strengths.

In a second step, a control signal is generated and communicated to a dynamic impedance module (step 710). As discussed above, the control signal may be generated by a clock, RC delay circuit, or other suitable circuit. Various additional components within the dynamic impedance module may statically or dynamically alter the characteristics of the control signal, including frequency, duration, amplitude and other characteristics. In response to the control signal, the dynamic impedance module switches the input impedance of the dynamic impedance receiver circuit between a high impedance state and a low impedance state. Energy retained by the junction capacitance within the photodetector is discharged to ground during the low impedance state (step 730). During the high impedance state, the higher energy pulses are converted into a voltage signals by a buffer stage (step 740). These voltage signals are received and processed by a digital circuit (step 750).

In sum, the dynamic impedance receiver circuit consumes less power than trans-impedance amplifiers or sense amplifiers. It also allows the circuit to detect low powered optical signals and get a voltage swing high enough to run the digital circuitry which the receiver is connected to.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A photodetector receiver circuit for an optical communication system, the receiver circuit comprising:
   an optical photodetector, said photodetector being configured to receive optical signals and convert said optical signals into an electrical current;
   a dynamic impedance module, said dynamic impedance module being further configured to switch said receiver circuit between a high impedance state and a low impedance state in response to a control signal; and
   a buffer stage configured to receive said electrical current and convert said electrical current into a voltage signal compatible with a digital circuit.

2. The circuit of claim 1, wherein said dynamic impedance module comprises a transistor, said transistor configured to be controlled by said control signal.

3. The circuit of claim 1, further comprising a clock signal, said clock signal, said dynamic impedance module being configured to be controlled by said clock signal.

4. The circuit of claim 1, further comprising a junction capacitance, said junction capacitance being charged during said high impedance state and discharged during said low impedance state.

5. The circuit of claim 1, wherein said electrical current is converted into said voltage signal during said high impedance state.

6. The circuit of claim 1, further comprising a counter interposed between said control signal and a transistor within said dynamic impedance module, said counter modifying said control signal.

7. The circuit of claim 1, further comprising a delay circuit, said delay circuit being configured to receive said voltage signal output by said buffer stage and delay said voltage signal to create said control signal.

8. The circuit of claim 7, further comprising an inverter buffer stage, said inverter buffer stage being interposed between said delay circuit and said transistor, said inverter buffer stage being configured to invert said control signal.

9. The circuit of claim 7, wherein said delay circuit comprises an RC delay circuit.

10. The circuit of claim 1, wherein said buffer stage comprises a buffer chain, said buffer chain comprising inverting transistors.

11. An optical communication system comprising:
    an optical transmitter, said optical transmitter being configured to convert an electrical signal into an optical pulse train;
    an optical medium, said optical pulse train traveling through said optical medium;
    a receiver circuit, said receiver circuit configured to receive said optical pulse train and convert said optical pulse train into an electrical signal compatible with a digital circuit, said receiver circuit comprising:
      a photodetector, said photodetector being configured to convert said optical pulse train into an electrical pulse train;
      a dynamic impedance module, said dynamic impedance module being configured to change an input impedance of said receiver circuit between a low impedance state and a high impedance state, said high impedance state occurring during electrical pulses and said low impedance state occurring during a time period between electrical pulses;
      a buffer stage, said buffer state being configured to receive said electrical pulses and converting said electrical pulses into an voltage signal; and
    a digital circuit, said digital circuit being configured to receiving said voltage signal, said voltage signal being compatible with a digital circuit.

12. A method for receiving an optical signal comprising:
    receiving said optical signal and converting said optical signal into an electrical pulse train, said electrical pulse train being made up of higher energy pulses separated by lower energy periods;
    switching a dynamic impedance module between a high impedance state and a low impedance state, said high impedance state occurring during said higher energy electrical pulses and said low impedance state occurring during said lower energy periods;
    transforming said electrical pulse train into a output voltage signal using a buffer stage during said high impedance state; and
    receiving said output voltage signal by a digital circuit.

13. The method of claim 12, further comprising discharging a junction capacitance during said low impedance state and transforming said higher energy pulses into said output voltage signal during said high impedance state.

14. The method of claim 12, further comprising switching said dynamic impedance module between said high impedance state and said low impedance state using a switching transistor controlled by a clock signal.

15. The method of claim 12, further comprising switching said dynamic impedance module between said high impedance state and said low impedance state using RC delay circuit, said RC delay circuit receiving said output voltage signal and delaying said output voltage signal to create a control signal, said dynamic impedance module being controlled by said control signal.

* * * * *